(12) United States Patent
Uchiyama et al.

(10) Patent No.: US 9,678,368 B2
(45) Date of Patent: Jun. 13, 2017

(54) SELF-DIMMING SYSTEM

(71) Applicant: ATSUMITEC CO., LTD., Shizuoka (JP)

(72) Inventors: Naoki Uchiyama, Shizuoka (JP); Tomomi Kanai, Shizuoka (JP)

(73) Assignee: ATSUMITEC CO., LTD., Shizuoka (JP)

(*) Notice: Subject to any disclaimer, the term of this patent is extended or adjusted under 35 U.S.C. 154(b) by 0 days.

(21) Appl. No.: 15/110,700

(22) PCT Filed: Jan. 21, 2015

(86) PCT No.: PCT/JP2015/051565
§ 371 (c)(1),
(2) Date: Jul. 8, 2016

(87) PCT Pub. No.: WO2015/111630
PCT Pub. Date: Jul. 30, 2015

(65) Prior Publication Data
US 2016/0327817 A1 Nov. 10, 2016

(30) Foreign Application Priority Data
Jan. 22, 2014 (JP) ................................. 2014-009465

(51) Int. Cl.
*G02F 1/01* (2006.01)
*G02F 1/163* (2006.01)
(Continued)

(52) U.S. Cl.
CPC .......... *G02F 1/0147* (2013.01); *G02F 1/0121* (2013.01); *G02F 1/163* (2013.01);
(Continued)

(58) Field of Classification Search
CPC ........ G02F 1/01; G02F 1/0121; G02F 1/0147; G02F 1/15; G02F 1/1523; G02F 1/1525;
(Continued)

(56) References Cited

U.S. PATENT DOCUMENTS 3,453,038 A * 7/1969 Kissa ..................... B41M 5/20
252/62.2
5,384,653 A * 1/1995 Benson .................. G02F 1/153
359/265
(Continued)

FOREIGN PATENT DOCUMENTS

| JP | 2006-243485 A | 9/2006 |
| JP | 2008-020586 A | 1/2008 |

(Continued)

OTHER PUBLICATIONS

International Search Report (including English translation) and Written Opinion dated Mar. 10, 2015, for corresponding PCT Application No. PCT/JP2015/051565.

*Primary Examiner* — Loha Ben
(74) *Attorney, Agent, or Firm* — Kinney & Lange, P.A.

(57) ABSTRACT

To provide a self-dimming system including: a main body section which is configured by a pair of transparent substrates arranged to face each other and to be separated from each other, and a frame body holding the pair of transparent substrates and forming a gap together with the pair of transparent substrates; a dimming section which is arranged in the gap and provided with a dimming element whose optical properties are reversibly changed by hydrogenation and dehydrogenation of the dimming element; a power-generating equipment which is arranged in the main body section; a hydrogen suction and discharge section which, when receiving electric power generated in the power-generating equipment, generates hydrogen by performing electrolysis and supplies the hydrogen to the gap and which, (Continued)

when not receiving electric power generated in the power-generating equipment, generates electric power by using the hydrogen in the gap; and control means which controls whether or not electric power generated in the power-generating equipment is supplied to the hydrogen suction and discharge section.

7 Claims, 6 Drawing Sheets

(51) Int. Cl.
G02F 1/153 (2006.01)
H01M 8/00 (2016.01)
H01M 8/06 (2016.01)

(52) U.S. Cl.
CPC ............... *G02F 1/153* (2013.01); *H01M 8/00* (2013.01); *H01M 8/06* (2013.01); *H01M 2250/10* (2013.01); *Y02B 90/14* (2013.01)

(58) Field of Classification Search
CPC .......... G02F 1/153; G02F 1/155; G02F 1/163; G02F 2001/1519; G02F 2001/1536; G02F 2202/34; G02F 2203/01; H01M 8/00; H01M 8/06; H01M 2250/10; Y02B 90/14; H01G 9/0036; B32B 17/10036

USPC ....... 359/245, 265, 270, 271, 273–275, 288; 204/228.1, 228.6, 230.2, 230.5, 230.8, 204/232; 205/170, 171, 173; 361/528

See application file for complete search history.

(56) References Cited

U.S. PATENT DOCUMENTS

| | | | |
|---|---|---|---|
| 5,604,626 A * | 2/1997 | Teowee | B32B 17/10036 359/265 |
| 6,552,843 B1 * | 4/2003 | Tench | G02F 1/1506 359/267 |
| 8,722,323 B2 * | 5/2014 | Wohlstadter | B01L 3/5027 204/403.01 |
| 8,773,746 B2 * | 7/2014 | Tajima | C03C 17/36 359/267 |
| 9,224,538 B2 * | 12/2015 | Naito | H01G 9/0036 |
| 2004/0206024 A1 | 10/2004 | Graf et al. | |

FOREIGN PATENT DOCUMENTS

| | | |
|---|---|---|
| JP | 2013-118085 A | 6/2013 |
| JP | 2014-134676 A | 7/2014 |

\* cited by examiner

SELF-DIMMING SYSTEM

TECHNICAL FIELD

The present invention relates to a self-dimming system provided with a gas chromic dimming member.

BACKGROUND ART

In a general building, there are many places where heat is taken in and out through a window portion. Specifically, when air cooling is performed during summer, heat is taken from the outside of the building into the inside of the building so as to increase indoor temperature, and when air heating is performed during winter, heat is discharged from the inside of the building to the outside of the building so as to lower indoor temperature. That is, a large amount of energy is lost through the window of the building, which reduces the cooling and heating efficiency.

Further, since light is transmitted through the window of the building, it is possible to view the outside from the inside of the building, or it is possible to view the inside from the outside of the building. Here, in a window of a bathroom in the general building, it is desired that, during use of the bathroom, the bathroom is prevented from being viewed from the outside of the building. Therefore, the window is provided with a blinder plate which is made of an acrylic plate or the like and is referred to as a louver. However, in such a case where the bathroom is not used, it is preferred that light is taken into the bathroom through the window. Therefore, it is necessary that the amount of light taken into the bathroom is changed by adjusting the amount of opening of the louver according to the use state of the bathroom.

In order to solve the above-described problem in the window, research and development of dimming glass are conventionally performed. As the dimming glass, there are glass whose transmissivity is changed according to the amount of current or voltage supplied to the glass, glass whose transmissivity is changed according to temperature, and glass whose transmissivity is changed by controlling ambient gas. Among these types of glass, the glass whose transmissivity is changed by controlling ambient gas has been receiving particular attention from the viewpoint of the simplification of structure and the reduction of cost.

For example, as dimming glass whose transmissivity is changed by controlling ambient gas, a reflection type dimming thin film material, which can be colorless and transparent, is disclosed in Patent Document 1. In the dimming glass which is represented by Patent Document 1 and which is also referred to as gas chromic glass, the transmissivity is controlled by adjusting the amount of hydrogen inside of the glass in such a manner that hydrogen is introduced to the inside of the glass (hydrogenation), and further that the amount of the introduced hydrogen is reduced, such as by discharging the hydrogen (dehydrogenation).

PRIOR ART DOCUMENT

Patent Document

Patent Document 1: Japanese Patent Laid-Open No. 2008-20586

SUMMARY OF THE INVENTION

Problems to be Solved by the Invention

However, the gas chromic glass described above requires: an apparatus, such as a pump, for introducing ambient gas, such as hydrogen, to the inside of the glass; an apparatus, such as a pump, for discharging the introduced hydrogen; and a gas cylinder, or the like, filled with the ambient gas, such as hydrogen. Therefore, the size and cost of the system, which functions as the dimming glass, become large. Further, a power supply for driving the apparatuses, such as the pumps, is required, and hence it is further difficult to reduce the size and cost of the system.

The present invention has been made in view of the above described circumstances. An object of the present invention is to provide a self-dimming system which does not require external power supply and which can reduce the size and cost of the system.

Means for Solving the Problems

In order to achieve the above-described object, the present invention provides a self-dimming system including: a main body section which is configured by a pair of transparent substrates arranged to face each other and to be separated from each other, and a frame body holding the pair of transparent substrates and forming a gap together with the pair of transparent substrates; a dimming section which is arranged in the gap and provided with a dimming element whose optical properties are reversibly changed by hydrogenation and dehydrogenation of the dimming element; a power-generating equipment which is arranged in the main body section; a hydrogen suction and discharge section which, when receiving electric power generated in the power-generating equipment, generates hydrogen by performing electrolysis and supplies the hydrogen to the gap and which, when not receiving electric power generated in the power-generating equipment, generates electric power by using the hydrogen in the gap; and control means which controls whether or not electric power generated in the power-generating equipment is supplied to the hydrogen suction and discharge section.

Advantageous Effects of the Invention

With the self-dimming system according to the present invention, the need of external power supply is eliminated by efficiently generating and storing electric power in the system, and further the size and cost of the system can be reduced.

MODE FOR CARRYING OUT THE INVENTION

In the following, an embodiment according to the present invention will be described in detail with reference to the accompanying drawings. It should be noted that the present invention is not limited to the contents described below and can be implemented by being arbitrarily changed within the scope and spirit of the present invention. Further, each of the drawings used in the description of the embodiment schematically shows a self-dimming system and components thereof according to the present invention, and in order to promote better understanding, partial emphasis, enlargement, contraction, omission, or the like, is made, and hence there is a case where the scale, shape, or the like, of each of the components are not accurately represented. Further, each of various numerical values used in the embodiment shows an example and can be variously changed as needed.

<<Embodiment>>

<Structure of Self-Dimming System>

Figure 1:
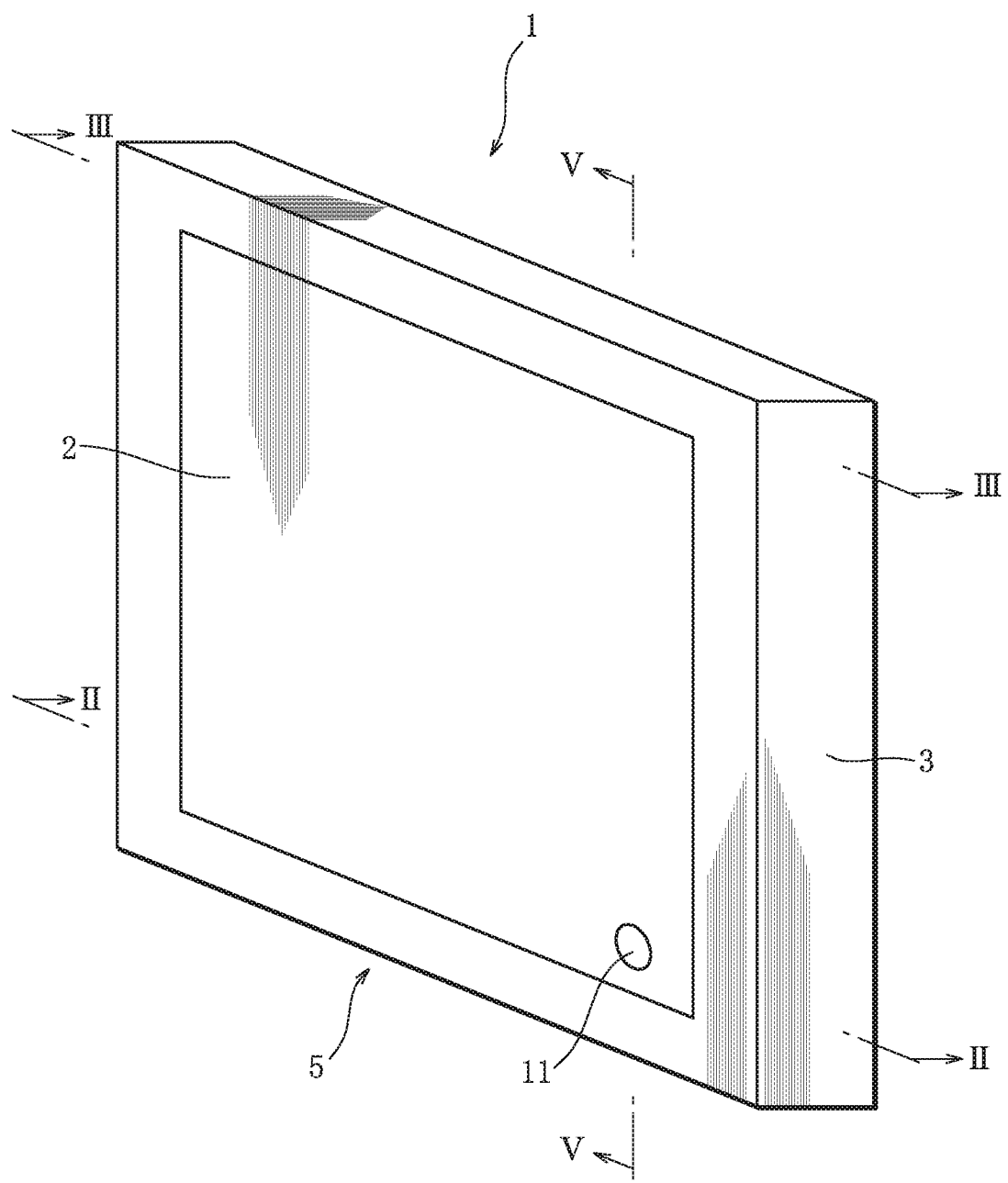
FIG. 1 is a perspective view showing an outline of an entire configuration of a self-dimming system according to an embodiment.
Figure 2:
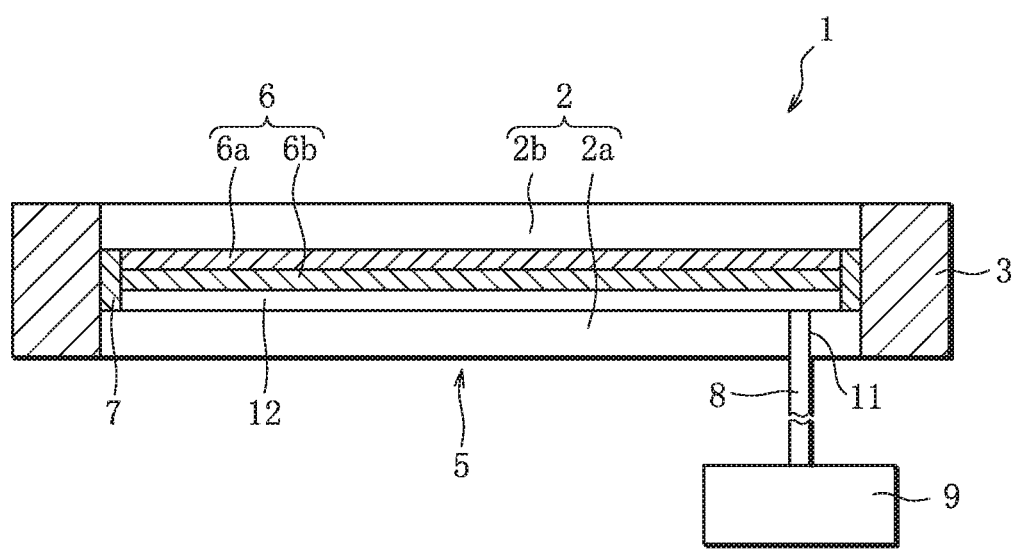
FIG. 2 is a sectional view of the self-dimming system, taken along the line II-II of FIG. 1.
Figure 3:
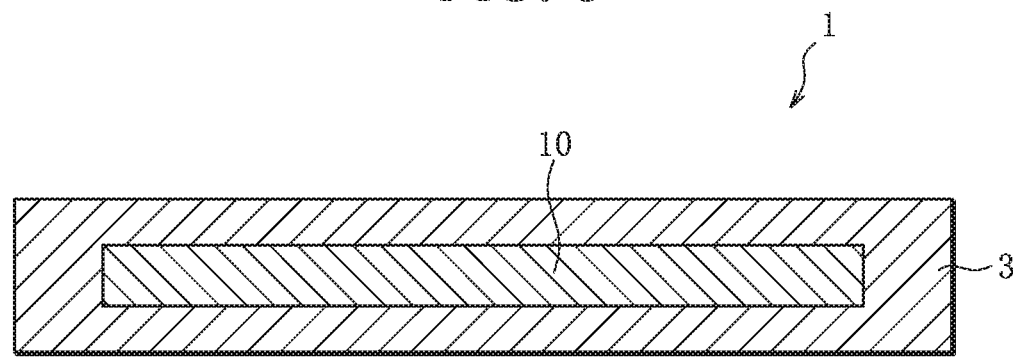
FIG. 3 is a sectional view of the self-dimming system, taken along the line III-III of FIG. 1.
Figure 4:
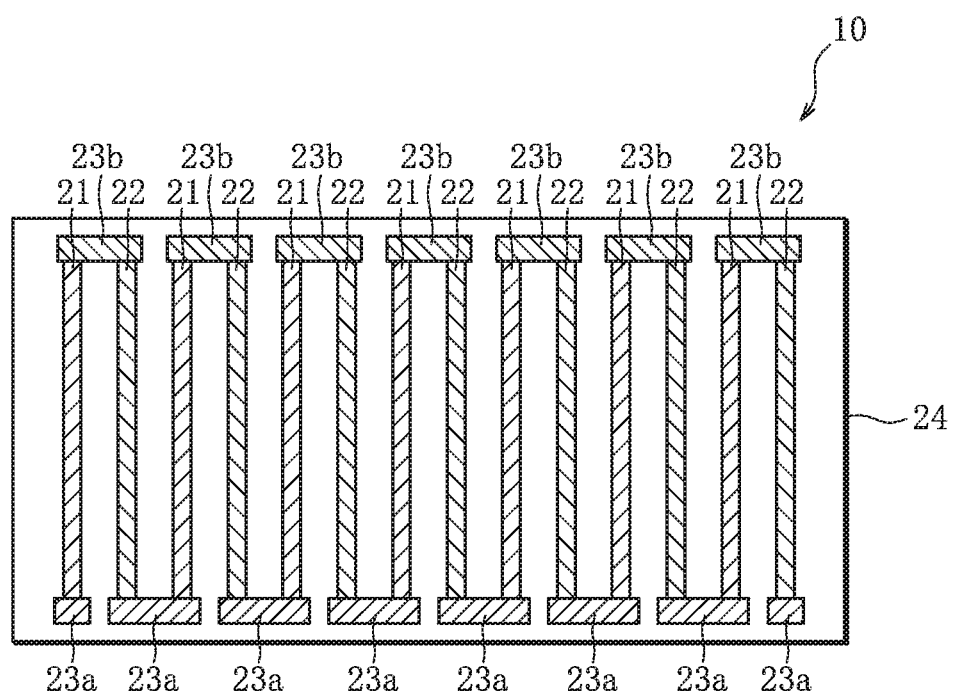
FIG. 4 is an enlarged sectional view of a thermoelectric conversion module in FIG. 3.
Figure 5:
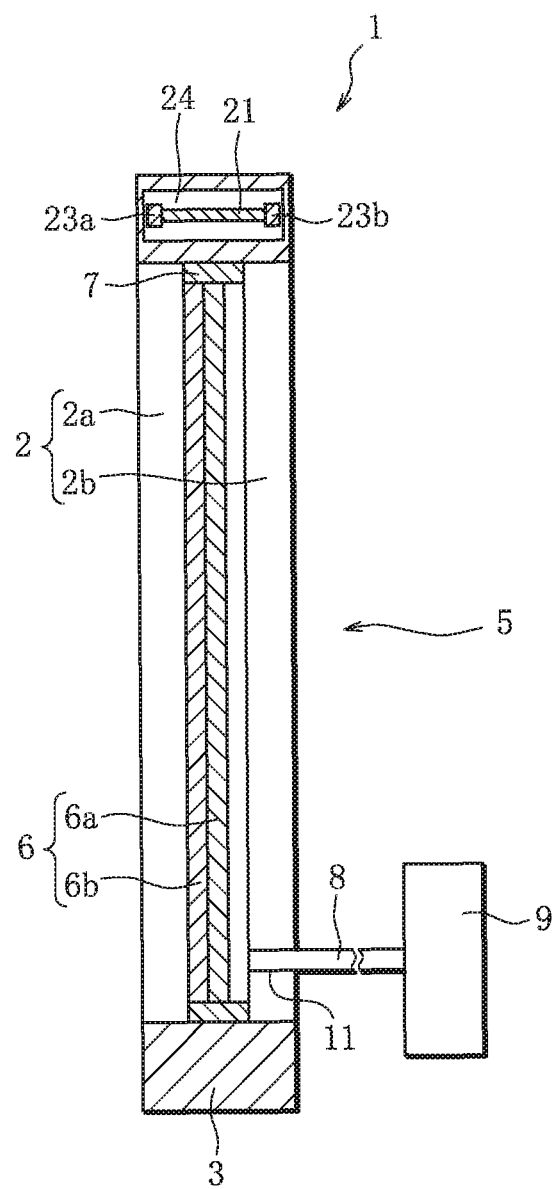
FIG. 5 is a sectional view of the self-dimming system, taken along the line V-V of FIG. 1.

First, a configuration of a self-dimming system 1 according to an embodiment of the present invention will be described with reference to FIG. 1 to FIG. 5. FIG. 1 is a perspective view showing an outline of an entire configuration of the self-dimming system 1 according to the embodiment. FIG. 2 is a sectional view of the self-dimming system 1, taken along the line II-II of FIG. 1. FIG. 3 is a sectional view of the self-dimming system 1, taken along the line III-III of FIG. 1. FIG. 4 is an enlarged sectional view of a thermoelectric conversion module in FIG. 3. FIG. 5 is a sectional view of the self-dimming system 1, taken along the line V-V of FIG. 1.

As can be seen from FIG. 1 and FIG. 2, the self-dimming system 1 according to the present embodiment includes a main body section 5 configured by a transparent substrate 2 having light transmissivity, and a frame body 3 fixing the transparent substrate 2, and has a configuration in which a dimming section 6 and a heating section 7 are arranged in the main body section 5. Further, as shown in FIG. 2, the self-dimming system 1 includes an electric dehumidifier (hydrogen suction and discharge section) 9 connected to the main body section 5 via a pipe 8. Further, as shown in FIG. 3, the self-dimming system 1 includes a thermoelectric conversion module 10 which functions as a power-generating equipment and which is provided in the inside of the frame body 3 configuring the main body section 5. In the following, each of the components will be described in detail.

(Transparent Substrate)

As shown in FIG. 2, the transparent substrate 2 is configured by a first transparent substrate 2a and a second transparent substrate 2b which are arranged to face each other and to be separated from each other. In the present embodiment, each of the first transparent substrate 2a and the second transparent substrate 2b has a plate shape and the same dimension. Further, each of the first transparent substrate 2a and the second transparent substrate 2b is formed of a material capable of transmitting visible light. Further, it is assumed that the self-dimming system 1 according to the present embodiment is used in a window in a general house. Therefore, it is preferred that the transparent substrate 2 is formed by a member which is relatively strong and which is not subject to damage, and the like, due to external force. For example, a member, which is made of glass, plastic, or the like, and which has relatively high transmissivity for visible light, is preferably used as the transparent substrate 2. As a member made of plastic, it is possible to use, for example, a member made of acrylic, polycarbonate, polyethylene terephthalate (PET), polyethylene naphthalate (PEN), or the like.

It should be noted that the shape of each of the first transparent substrate 2a and the second transparent substrate 2b is not limited to the plate shape described above. For example, the transparent substrate 2 having a desired curvature may also be formed by bending the first transparent substrate 2a and the second transparent substrate 2b. Further, according to the place at which the self-dimming system 1 according to the present embodiment is installed, each of the first transparent substrate 2a and the second transparent substrate 2b may be formed to have a shape other than a square planar shape and a rectangular planar shape. For example, each of the first transparent substrate 2a and the second transparent substrate 2b may be formed to have a disc-like shape.

As shown in FIG. 1 and FIG. 2, the second transparent substrate 2b is provided with a through hole 11. The pipe 8 is fittingly inserted into the through hole 11. In the state where the pipe 8 is fittingly inserted into the through hole 11 of the second transparent substrate 2b, the suction and discharge of hydrogen into and from a gap 12 between the first transparent substrate 2a and the second transparent substrate 2b can be performed through the pipe 8. It should be noted that the through hole 11 with the pipe 8 fittingly inserted thereinto is not limited to being formed in the second transparent substrate 2b, and, for example, may be formed in the first transparent substrate 2a or the frame body 3. Further, in the case where the self-dimming system 1 according to the present embodiment is installed in a desired place and used, it is preferred that the installation place of the through hole 11 is determined so that the design characteristics of the self-dimming system 1 are not impaired when the pipe 8 is visually recognized.

(Frame Body)

The first transparent substrate 2a and the second transparent substrate 2b are held by the frame body 3 so as to face each other and to be separated from each other. As a method for fixing the transparent substrate 2 to the frame body 3, the transparent substrate 2 may be fitted in a groove or the like of the frame body 3, or the transparent substrate 2 may be joined to the frame body 3 by using screws or a bonding material, such as adhesive. Further, the frame body 3 forms the gap 12 together with the first transparent substrate 2a and the second transparent substrate 2b which are a pair of the transparent substrates 2.

As a material of the frame body 3, it is preferred to use a relatively strong member from the viewpoint that the member can firmly hold the transparent substrate 2 and is not damaged under the influence of external force. Further, since the shape of the frame body 3 needs to be changed according to the shape of the transparent substrate 2, it is preferred that the frame body 3 is made of a material which can be easily processed. For example, as the material of the frame body 3, metal, such as aluminum, or resin can be used.

Here, it is preferred that the frame body 3 is provided to completely seal the gap 12 between the first transparent substrate 2a and the second transparent substrate 2b and to thereby prevent leaking of hydrogen introduced in the gap 12. However, the gap 12 between the first transparent substrate 2a and the second transparent substrate 2b may not be completely sealed as long as the hydrogenation can be sufficiently performed in the dimming section 6. That is, although it is preferred that the gap 12 formed by the transparent substrates 2 and the frame body 3 is completely sealed, the gap 12 may not be completely sealed by the transparent substrates 2 and the frame body 3 as long as the amount of hydrogen leaking from the gap 12 is sufficiently smaller than the amount of hydrogen supplied to the gap 12.

(Dimming Section)

As shown in FIG. 2, the dimming section 6 is configured by a dimming element 6a which is hydrogenated and dehydrogenated to reversibly change optical properties thereof, and a catalyst layer 6b which promotes hydrogenation and dehydrogenation reactions in the dimming element 6a. With such configuration, the dimming section 6 can efficiently change the transmissivity for visible light by suction and discharge of hydrogen into and from the gap 12. As a more specific configuration, the dimming element 6a is formed on the surface of the first transparent substrate 2a to face the second transparent substrate 2b. Further, the catalyst layer 6b is laminated on the surface of the dimming element 6a (that is, on the surface facing the second transparent substrate 2b). Here, it is preferred that the catalyst layer 6b is completely separated from the second transparent substrate 2b. However, the catalyst layer 6b may be partially in contact with the second transparent substrate 2b as long as hydrogen can be diffused between the catalyst layer 6b and the second transparent substrate 2b.

As the material of the dimming element 6a, it is possible to use one of two kinds of materials of a reflection type dimming body and an absorption type dimming body. As the dimming element 6a of the reflection type dimming body, it is possible to use, for example, a magnesium alloy thin film. Especially, from the viewpoint of durability, it is possible to preferably use an alloy thin film of magnesium and transition metal, such as a magnesium-nickel alloy thin film or a magnesium-yttrium alloy thin film. As the dimming element 6a of the absorption type dimming body, it is possible to use a transition-metal oxide film containing one or more materials selected from tungstic oxide, molybdenum oxide, chrome oxide, cobalt oxide, nickel oxide, and titanium oxide. Especially, from the viewpoint of coloring efficiency, it is preferred to use a tungstic oxide thin film.

The film thickness of the dimming element 6a can be suitably changed according to the amount of visible light to be transmitted through the dimming element 6a. For example, the film thickness of the dimming element 6a of the reflection type dimming body is preferably adjusted in the range of about 30 nm to 100 nm, and the film thickness of the dimming element 6a of the absorption type dimming body is preferably adjusted in the range of about 300 nm to 800 nm. It should be noted that, when the dimming section 6 is formed of a plurality of the dimming elements 6a, the film thickness of the dimming element 6a means the thickness of each of the dimming elements 6a.

The dimming element 6a is formed by a known film forming technique, such as a sputtering method, a vacuum vapor deposition method, an electron beam evaporation method, a chemical vapor deposition method, or a sol-gel method. Further, the dimming element 6a may be formed to have a laminated structure having two or more layers by using one of the film forming techniques described above. In such case, the layer formed of the reflection type dimming body may be combined with the layer formed of the absorption type dimming body.

The catalyst layer 6b may be formed by forming a film of palladium or platinum by using a known film forming technique, such as a sputtering method, a vacuum vapor deposition method, an electron beam evaporation method, or a chemical vapor deposition method. The layer thickness of the catalyst layer 6b can be suitably changed according to the required reaction rate of hydrogenation and dehydrogenation, but can be set in the range of, for example, about 2 nm to 10 nm. It should be noted that, as long as the reaction rate of hydrogenation and dehydrogenation described above can be improved, the material of the catalyst layer 6b is not limited to these materials, and other catalyst materials may be used.

It should be noted that a buffer layer may be provided between the dimming element 6a and the catalyst layers 6b in order to prevent mutual diffusion of the component of the dimming element 6a and the component of the catalyst layer 6b. For example, the buffer layer may be formed by forming a thin film of metal, such as titanium, niobium, tantalum, or vanadium by using a known film forming technique, such as a sputtering method, a vacuum vapor deposition method, an electron beam evaporation method, or a chemical vapor deposition method.

Further, a protective film, which transmits hydrogen and which prevents oxidization of the dimming element 6a, may be provided on the exposed surface (that is, the surface not in contact with the dimming element 6a) of the catalyst layer 6b. That is, a protective film, made of a material which transmits hydrogen and which repels water, may be formed on a desired surface of the catalyst layer 6b. For example, as the protective film, it is possible to use a polymer, such as polytetrafluoroethyl, polyvinyl acetate, polyvinyl chloride, polystyrene, and cellulose acetate, or an inorganic thin film, such as a titanium oxide thin film. When the polymer is used, the protective film can be formed in a manner that a dispersion liquid formed by dispersing the polymer is applied and then dried. When the inorganic thin film is used, the protective film can be film-formed by the sputtering method.

In the present embodiment, the dimming section 6 is arranged on the surface of the first transparent substrate 2a, which surface faces the second transparent substrate 2b, but may be arranged at any other place as long as the dimming section 6 is arranged in the gap 12. For example, the dimming section 6 may be formed on the surface of the second transparent substrate 2b, which surface faces the first transparent substrate 2a. Further, the dimming section 6 may be formed on each of mutually facing surfaces of the first transparent substrate 2a and the second transparent substrate 2b.

(Heating Section)

In the present embodiment, a sheet-shaped heater, which generates heat by an electric current supplied thereto, is used as the heating section 7. As can be seen from FIG. 2 and FIG. 5, the heating section 7 is arranged between the dimming section 6 and the frame body 3, so as to surround the outer edge portion of the dimming section 6. With such configuration, the dimming element 6a of the dimming section 6 can be directly heated by the heating section 7, so that the dehydrogenation of the dimming section 6 is promoted by heating by the heating section 7.

It should be noted that the heating section 7 is not limited to the sheet-shaped heater, and a heating mechanism of other configuration may also be used as long as the heating mechanism can heat the dimming section 6. For example, the dimming section 6 may be heated via the transparent substrate 2 in such a manner that a heater wiring is embedded in the transparent substrate 2, and that an electric current is supplied to the heater wiring. Further, since the dimming section 6 is formed of the metal thin film, a circuit may be configured to supply an electric current to the dimming section 6, so that the dimming section 6 directly increases its temperature.

(Electric Dehumidifier)

As shown in FIG. 2 and FIG. 5, the electric dehumidifier 9 is connected to the main body section 5 via the pipe 8. When receiving electric power, the electric dehumidifier 9 electrically decomposes water to generate hydrogen. Further, when not receiving electric power, the electric dehumidifier 9 generates water and electrical energy by making hydrogen and oxygen react with each other, and thereby stores the generated electric power. That is, the electric dehumidifier 9 has a function of a common dehumidifier and a function of a fuel cell, and can switch the two functions according to whether or not electric power is supplied to the electric dehumidifier 9.

More specifically, when receiving electric power, the electric dehumidifier 9 according to the present embodiment performs electrolysis by using water vapor in the air around the electric dehumidifier 9, as a result of which the water vapor is decomposed into hydrogen and oxygen. That is, when receiving electric power, the electric dehumidifier 9 exhibits a general dehumidifying function. Further, the electric dehumidifier 9 discharges, via the pipe 8, hydrogen generated by the electrolysis. Here, the pipe 8 is fittingly inserted into the through hole 11 of the second transparent substrate 2b to communicate with the gap 12, and hence the hydrogen generated by the electrolysis reaches the inside of the gap 12. That is, when receiving electric power, the electric dehumidifier 9 performs dehumidification of ambient air, and supplies hydrogen produced by the dehumidification to the gap 12 via the pipe 8 to promote the hydrogenation of the dimming section 6.

On the other hand, when not receiving electric power, the electric dehumidifier 9 sucks hydrogen in the gap 12 via the pipe 8 and also sucks oxygen in the air around the electric dehumidifier 9. Further, the electric dehumidifier 9 makes the hydrogen and the oxygen react with each other to generate water (water vapor) and electrical energy, and stores the generated electrical energy (electric power) in a storage section (not shown) in the electric dehumidifier 9. That is, when not receiving electric power, the electric dehumidifier 9 promotes the dehydrogenation of the dimming section 6 by sucking hydrogen in the gap 12. Therefore, the electric dehumidifier 9 functions as a fuel cell in which hydrogen in the gap 12 is used as a fuel source.

With the above-described configuration, the electric dehumidifier 9 according to the present embodiment functions as a hydrogen suction and discharge section. As the electric dehumidifier 9 which functions as such hydrogen suction and discharge section, for example, a polymer electrolyte fuel cell (PEFC), or a phosphoric acid fuel cell (PAFC) may be used.

(Thermoelectric Conversion Module)

As shown in FIG. 1, FIG. 3 and FIG. 5, the thermoelectric conversion module 10 as a power-generating equipment is arranged in the frame body 3. Specifically, the thermoelectric conversion module 10 is arranged in the frame body 3 having a square external shape and is arranged along one side of the four sides of the frame body 3. In other words, the thermoelectric conversion module 10 is provided in the main body section 5.

As shown in FIG. 4, the thermoelectric conversion module 10 includes a first thermoelectric conversion element 21 made of a P-type semiconductor material, a second thermoelectric conversion element 22 made of a N-type semiconductor material, and electrodes 23a and 23b each bonded to both ends of the first thermoelectric conversion element 21 and the second thermoelectric conversion element 22. Further, the thermoelectric conversion module 10 has the structure in which the above-described components are coated with an insulating resin 24, and is a thin sheet-like module as a whole.

In the present embodiment, each of the first thermoelectric conversion element 21 and the second thermoelectric conversion element 22 has the same external shape in which the diameter is 2 mm, and the length is 5 mm to 10 mm. Further, the first thermoelectric conversion element 21 and the second thermoelectric conversion element 22 are alternately arranged side by side. Also, each adjacent pair of the first thermoelectric conversion element 21 and the second thermoelectric conversion element 22 are mutually electrically connected by each of the electrodes 23a and 23b which are cut into small pieces. That is, the thermoelectric conversion module 10 has a configuration in which the first thermoelectric conversion element 21 and the second thermoelectric conversion element 22 are connected in series.

Each of the electrodes 23a and 23b is formed by a flat copper plate and is provided in contact with the end portions of the first thermoelectric conversion element 21 and the second thermoelectric conversion element 22. It should be noted that the electrodes 23a and 23b are not limited to the copper plate, and the other member, which is made of other metal or which has conductive properties, may also be used as the electrodes 23a and 23b.

Further, as can be seen from FIG. 5, the first thermoelectric conversion element 21 and the second thermoelectric conversion element 22 of the thermoelectric conversion module 10 extend from the first transparent substrate 2a toward the second transparent substrate 2b in the frame body 3. That is, the one side end portions of the first thermoelectric conversion element 21 and the second thermoelectric conversion element 22, and the electrodes 23a are located on the side of the first transparent substrate 2a. Further, the other side end portions of the first thermoelectric conversion element 21 and the second thermoelectric conversion element 22, and the electrodes 23b are located on the side of the second transparent substrate 2b. In such arrangement of the thermoelectric conversion module 10, when a temperature difference is generated between the side of the first transparent substrate 2a and the side of the second transparent substrate 2b, the thermoelectric conversion module 10 generates electric power. For example, when the self-dimming system 1 according to the present embodiment is installed instead of a general window in a house, the thermoelectric conversion module 10 generates electric power due to the difference between the indoor temperature (that is, the temperature on the side of the first transparent substrate 2a) and the outdoor temperature (that is, the temperature on the side of the second transparent substrate 2b).

Further, the thermoelectric conversion module 10 of the present embodiment is provided in a part of the frame body 3 but may also be provided annularly so as to surround the outer edge of the transparent substrate 2. That is, the thermoelectric conversion module 10 may be provided in the most inner portion (entire part) of the frame body 3. In this case, the amount of power (electromotive force) generated by the thermoelectric conversion module 10 can be increased.

Further, in the present embodiment, the thermoelectric conversion module 10 is used as a power-generating equipment, but the power-generating equipment is not limited to this. For example, when the self-dimming system 1 according to the present embodiment is installed instead of a general window in a house, a photovoltaic power generation module may also be used. In this case, it is preferred that the photovoltaic power generation module is arranged on the surface of the frame body 3 (especially, on the surface of the frame body 3 on the side of the first transparent substrate 2a located on the outdoor side), or on the surface of the transparent substrate 2 (especially, on the surface of the first transparent substrate 2a located on the outdoor side).

<Electrical Configuration of Self-Dimming System>

Next, an electrical configuration of the self-dimming system 1 according to the present embodiment will be described with reference to FIG. 6. Here, FIG. 6 is a block diagram of the self-dimming system 1 according to the present embodiment.

Figure 6:
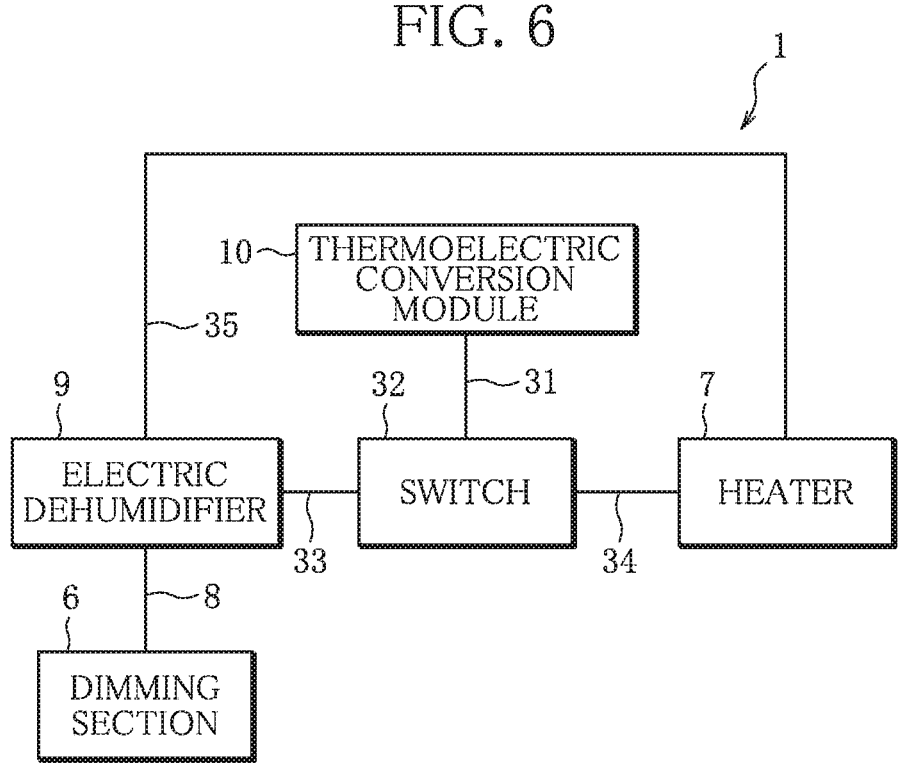
FIG. 6 is a block diagram of the self-dimming system according to the embodiment.

As shown in FIG. 6, the thermoelectric conversion module 10 is electrically connected to a switch 32 via a wiring 31. Further, the switch 32 is electrically connected to the electric dehumidifier 9 via a wiring 33 and is electrically connected to the heating section 7 via a wiring 34. In such wiring structure, the thermoelectric conversion module 10 can supply generated electric power to the electric dehumidifier 9 and the heating section 7 via the switch 32.

The switch 32 is installed at a place where a user of the self-dimming system 1 can view and easily operate the switch 32. For example, the switch 32 may be installed on the transparent substrate 2 or at the frame body 3. Further, the self-dimming system 1 is configured such that the electric power generated by the thermoelectric conversion module 10 is supplied to one of the electric dehumidifier 9 and the heating section 7 by switching the switch 32. That is, the switch 32 functions as control means which controls whether or not the electric power generated by the thermoelectric conversion module 10 is supplied to the electric dehumidifier 9.

Further, as shown in FIG. 6, the electric dehumidifier 9 is connected to the dimming section 6 via the pipe 8. Thereby, the electric dehumidifier 9 decomposes water by using the electric power supplied via the switch 32. The hydrogen generated by the electrolysis can be supplied to the dimming section 6 via the pipe 8. Further, when not receiving electric power via the switch 32, the electric dehumidifier 9 can suck hydrogen from the dimming section 6 via the pipe 8, to store the electric power therein.

Further, as shown in FIG. 6, the electric dehumidifier 9 is electrically connected to the heating section 7 via a wiring 35. Thereby, the electric power stored in the electric dehumidifier 9 is supplied to the heating section 7 via the wiring 35. Therefore, the heating section 7 receives electric power via the switch 32 and, at the same time, receives electric power from the electric dehumidifier 9. Thereby, the dimming section 6 can be favorably heated.

It should be noted that, in the present embodiment, the switch 32 is used as the control means which controls whether or not the electric power is supplied to the electric dehumidifier 9, but the means is not limited to the switch 32 which simply performs switching (analog type) as in the present embodiment. A device, such as a microprocessor, which controls supply of the electric power according to the environment of the self-dimming system 1, may also be used as long as the device can control whether or not the electric power is supplied to the electric dehumidifier 9.

Further, the switch 32 may control only whether or not electric power is supplied to the electric dehumidifier 9. That is, the switch 32 may be configured such that the electric power generated by the thermoelectric conversion module 10 is not supplied to the heating section 7. Even in this case, the electric power stored in the electric dehumidifier 9 is supplied to the heating section 7, and thereby the dimming section 6 can be heated at a desired timing.

Further, the destination, to which the electric power generated by the electric dehumidifier 9 is supplied, is not limited to the heating section 7, but any electrical or electronic device can be used as long as the device periodically requires electric power from the electric dehumidifier 9. For example, the electric power may be supplied to the microprocessor described above.

<Use Mode of Self-Dimming System>

Next, the use mode of the self-dimming system 1 according to the present embodiment will be described with reference to FIG. 7 and FIG. 8. Here, each of FIG. 7 and FIG. 8 is a block diagram for explaining the flow of electric power, hydrogen, and heat in the self-dimming system 1 according to the present embodiment.

The self-dimming system 1 according to the present embodiment is provided at an installation portion of a general window in a house, for example. That is, the transparent substrate 2 according to the present embodiment is used as a window, and the frame body 3 is used as the flame of the window. Further, in the present embodiment, the first transparent substrate 2a configuring the transparent substrate 2 is arranged on the outdoor side, and the second transparent substrate 2b is arranged on the indoor side, but the arrangement may be reversed.

In a general house, when the sunlight is strong and the outside temperature is high (for example, in summer), it is necessary to shield the sunlight for increasing the indoor cooling effect. In this case, it is necessary that the amount of hydrogen around the dimming section 6 (that is, in the gap 12) is reduced to promote the dehydrogenation in the dimming section 6 so that the transmissivity for visible light is reduced in the dimming section 6. In order to promote the dehydrogenation in the dimming section 6, as shown in FIG. 7, the electric power supply from the thermoelectric conversion module 10 to the electric dehumidifier 9 is stopped, so that the electric dehumidifier 9 is made to function as a fuel cell.

Figure 7:
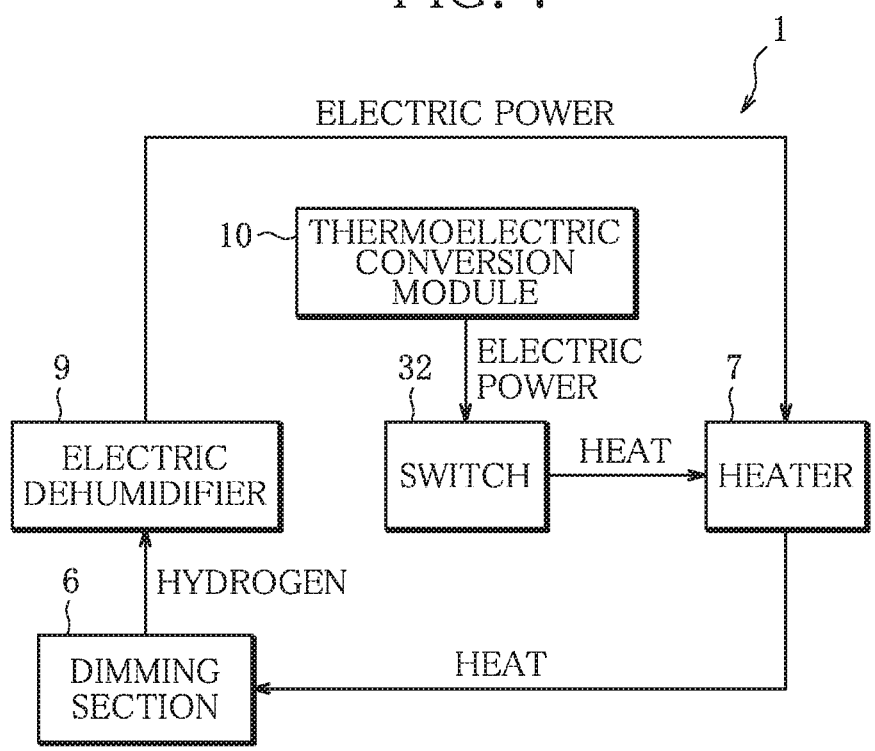
FIG. 7 is a block diagram for explaining the flow of electric power, hydrogen, and heat in the self-dimming system according to the present embodiment.
Figure 8:
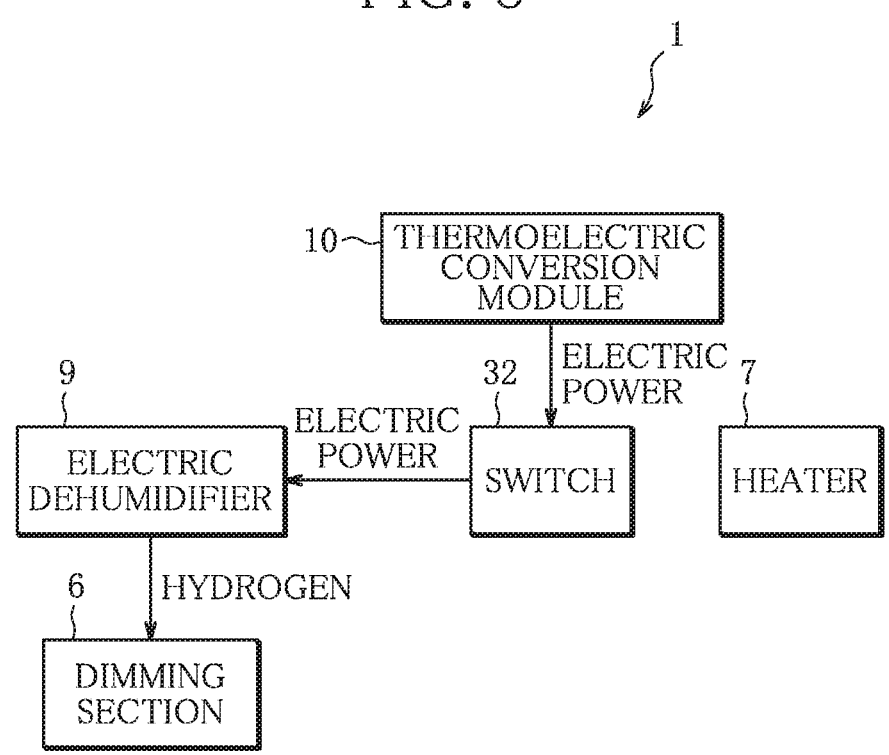
FIG. 8 is a block diagram for explaining the flow of electric power, hydrogen, and heat in the self-dimming system according to the present embodiment.

As shown in FIG. 7, when the electric dehumidifier 9 is made to function as the fuel cell, the electric dehumidifier 9 sucks hydrogen in the gap 12, and thereby hydrogen around the dimming section 6 is reduced, so that the dehydrogenation in the dimming section 6 is promoted. Here, electric power generated by the electric dehumidifier 9 is supplied to the heating section 7 and is consumed in the heating section 7. When the electric power is consumed in the heating section 7 in this way, the electric dehumidifier 9 is required to continuously generate electric power, so that the electric dehumidifier 9 continuously sucks hydrogen in the gap 12. That is, when the power supply from the thermoelectric conversion module 10 to the electric dehumidifier 9 is stopped, the electric dehumidifier 9 continuously sucks hydrogen in the gap 12, and the dehydrogenation in the dimming section 6 is continuously performed, so that the transmissivity for visible light in the dimming section 6 can be maintained to a constant value.

When the power supply from the thermoelectric conversion module 10 to the electric dehumidifier 9 is stopped, electric power generated in the thermoelectric conversion module 10 is supplied to the heating section 7 via the switch 32. When the heating section 7 heats the dimming section 6 by using electric power supplied from the electric dehumidifier 9 and the thermoelectric conversion module 10, hydrogen around the dimming section 6 is more easily discharged to the electric dehumidifier 9, so that the dehydrogenation is promoted by the electric dehumidifier 9.

In this way, when the power supply to the electric dehumidifier 9 is stopped by the switch 32, the transmissivity for visible light in the dimming section 6 can be easily reduced, so that the state where visible light is not transmitted is maintained.

On the other hand, when the sunlight is weak and the outside temperature is low (for example, in winter), it is necessary to increase the indoor heating effect by transmitting the sunlight. In this case, it is necessary that hydrogen around the dimming section 6 (that is, in the gap 12) is increased to promote the hydrogenation in the dimming section 6 so that the transmissivity for visible light in the dimming section 6 is increased. In order to promote the hydrogenation in the dimming section 6, as shown in FIG. 8, the electric power is supplied from the thermoelectric conversion module 10 to the electric dehumidifier 9, so that the electric dehumidifier 9 is made to function as a dehumidifier. That is, the electric dehumidifier 9 electrically decomposes water.

As shown in FIG. 8, when the electric dehumidifier 9 is made to function as the dehumidifier, the electric dehumidifier 9 sucks water vapor (moisture) around the electric dehumidifier 9 to supply (discharge) hydrogen generated by the electrolysis to the inside of the gap 12. Thereby, hydrogen around the dimming section 6 is increased, so that the hydrogenation in the dimming section 6 is promoted. Here, since condensation is likely to occur on a window portion on the indoor side of the building in winter, much water vapor exists on the indoor side of the self-dimming system 1, and hence electrolysis of water can be effectively performed in the electric dehumidifier 9.

It should be noted that, when the sunlight is weak and the outside temperature is low as described above, electric power generated in the thermoelectric conversion module 10 is consumed by the electric dehumidifier 9 and is not stored in the electric dehumidifier 9, and hence electric power is not supplied to the heating section 7. Thereby, the dimming section 6 is not heated, so that discharge of hydrogen from the dimming section 6 to the electric dehumidifier 9 is less likely to occur.

In this way, when the power supply to the electric dehumidifier 9 is started with the switch 32, the transmissivity for visible light in the dimming section 6 can be easily increased, so that the state where visible light is transmitted is maintained.

As described above, in the self-dimming system 1 according to the present embodiment, the transmissivity for visible light in the dimming section 6 can be changed by using only the electric power generated in the thermoelectric conversion module 10 and the electric dehumidifier 9 which are installed in the self-dimming system 1. That is, the self-dimming system 1 according to the present embodiment can function as a self-dimming system without need of external power source.

<Effect of Embodiment>

The self-dimming system 1 according to the present embodiment includes: the main body section 5 which is configured by a pair of the transparent substrates 2 arranged to face each other and to be separated from each other, and the frame body 3 holding the transparent substrates 2 and forming the gap 12 together with the transparent substrates 2; the dimming section 6 which is arranged in the gap 12 and provided with the dimming element 6a whose optical properties are reversibly changed by hydrogenation and dehydrogenation of the dimming element 6a; the thermoelectric conversion module 10 which is a power-generating equipment and arranged in the main body section 5; the electric dehumidifier 9 that is a hydrogen suction and discharge section which, when receiving electric power generated in the thermoelectric conversion module 10, generates hydrogen by performing electrolysis and supplies the hydrogen to the gap 12, and which, when not receiving electric power generated in the thermoelectric conversion module 10, stores electric power by using hydrogen in the gap 12; and the switch 32 which controls whether or not electric power generated in the thermoelectric conversion module 10 is supplied to the electric dehumidifier 9.

In the self-dimming system 1 described above, since only the electric dehumidifier 9 and the thermoelectric conversion module 10, which are provided in the system, are used as power source, no external power source is needed, and hence the size and cost of the system itself can be easily reduced.

Further, in the self-dimming system 1 of the present embodiment, the electrolysis and the storage function of the electric dehumidifier 9 are switched and used, so that the supply of hydrogen to the gap 12, and the discharging of hydrogen from the gap 12 can be easily performed. For this reason, a pump for supplying and discharging hydrogen is not needed, and hence the size and cost of the system itself can be easily reduced.

Further, in the electric dehumidifier 9 of the present embodiment, the electrolysis and electric power storage are performed by using water vapor and oxygen in ambient air, and hydrogen in the gap 12, and hence it is not necessary to prepare a cylinder, or the like, filled with gas required for hydrogenation and dehydrogenation of the dimming section 6. Thereby, the size and cost of the system itself can be easily reduced.

The self-dimming system 1 according to the present embodiment is configured such that the heating section 7, which heats the dimming section 6 by using electric power stored in the electric dehumidifier 9, is provided, and such that, when electric power is not supplied to the electric dehumidifier 9, electric power is supplied from the thermoelectric conversion module 10 to the heating section 7. In this configuration, the electric dehumidifier 9 can be made to continuously function as a fuel cell, and hence the state where the transmissivity for visible light in the dimming section 6 is low can be maintained. Further, the dimming section 6 is heated by the heating section 7, and hence hydrogen in the gap 12 is likely to be discharged, so that the dehydrogenation of the dimming section 6 can be promoted.

The thermoelectric conversion module 10 of the self-dimming system 1 according to the present embodiment has a configuration in which a plurality of the thermoelectric conversion elements (the first thermoelectric conversion element 21 and the second thermoelectric conversion element 22) are provided in the frame body 3 to extend from the first transparent substrate 2a toward the second transparent substrate 2b. With such configuration of the thermoelectric conversion module 10, the self-dimming system 1 can be operated in conjunction with the temperature difference between the inside and outside of the house in which the self-dimming system 1 is provided.

<<Embodiments of the Present Invention>>

The self-dimming system according to the first embodiment of the present invention includes: the main body section which is configured by a pair of the transparent substrates arranged to face each other and to be separated from each other, and the frame body holding the pair of transparent substrates and forming the gap together with the pair of transparent substrates; the dimming section which is arranged in the gap and provided with the dimming element whose optical properties are reversibly changed by hydrogenation and dehydrogenation of the dimming element; the power-generating equipment which is arranged in the main body section; the hydrogen suction and discharge section which, when receiving electric power generated in the power-generating equipment, generates hydrogen by performing electrolysis and supplies the hydrogen to the gap and which, when not receiving electric power generated in the power-generating equipment, generates electric power by using the hydrogen in the gap; and the control means which controls whether or not electric power generated in the power-generating equipment is supplied to the hydrogen suction and discharge section.

The self-dimming system according to the second embodiment of the present invention includes, in the self-dimming system according to the first embodiment, the heating section which heats the dimming section by using electric power generated in the hydrogen suction and discharge section.

In the self-dimming system according to the third embodiment of the present invention, in the self-dimming system according to the second embodiment, the power-generating equipment supplies the electric power to the heating section when the electric power is not supplied to the hydrogen suction and discharge section.

In the self-dimming system according to the fourth embodiment of the present invention, in the self-dimming system according to one of the first to third embodiments, the power-generating equipment is a thermoelectric conversion module having a structure in which a plurality of the thermoelectric conversion elements are provided in the frame body to extend from one of the pair of transparent substrates toward the other of the pair of transparent substrates.

In the self-dimming system according to the fifth embodiment of the present invention, in the self-dimming system according to one of the first to third embodiments, the power-generating equipment is a photovoltaic power generation module arranged on the surface of the frame body.

In the self-dimming system according to the sixth embodiment of the present invention, in the self-dimming system according to one of the second and third embodiments, the heating section includes a sheet-shaped heater arranged in contact with the dimming section.

In the self-dimming system according to the seventh embodiment of the present invention, in the self-dimming system according to one of the second and third embodiments, the heating section is the heater wiring which is incorporated in the pair of transparent substrates.

EXPLANATION OF REFERENCE SIGNS

1 Self-dimming system
2 Transparent substrate
2a First transparent substrate
2b Second transparent substrate
3 Frame body
5 Main body section
6 Dimming section
6a Dimming element
6b Catalyst layer
7 Heating section
8 Pipe
9 Electric dehumidifier (hydrogen suction and discharge section)
10 Thermoelectric conversion module
11 Through hole
12 Gap
21 First thermoelectric conversion element
22 Second thermoelectric conversion element
23a, 23b Electrode
24 Insulating resin
31, 33, 34, 35 Wiring
32 Switch

The invention claimed is:

1. A self-dimming system comprising:
 a main body section which is configured by a pair of transparent substrates arranged to face each other and to be separated from each other, and a frame body holding the pair of transparent substrates and forming a gap together with the pair of transparent substrates;
 a dimming section which is arranged in the gap and provided with a dimming element whose optical properties are reversibly changed by hydrogenation and dehydrogenation of the dimming element;
 a power-generating equipment which is arranged in the main body section;
 a hydrogen suction and discharge section which, when receiving electric power generated in the power-generating equipment, generates hydrogen by performing electrolysis and supplies the hydrogen to the gap, and when not receiving electric power generated in the power-generating equipment, generates electric power by using the hydrogen in the gap; and
 control means which controls whether or not electric power generated in the power-generating equipment is supplied to the hydrogen suction and discharge section.

2. The self-dimming system according to claim 1, comprising a heating section which heats the dimming section by using electric power generated in the hydrogen suction and discharge section.

3. The self-dimming system according to claim 2, wherein the power-generating equipment supplies the electric power to the heating section when the electric power is not supplied to the hydrogen suction and discharge section.

4. The self-dimming system according to claim 2, wherein the heating section is a sheet-shaped heater arranged in contact with the dimming section.

5. The self-dimming system according to claim 2, wherein the heating section is a heater wiring which is incorporated in the pair of transparent substrates.

6. The self-dimming system according to claim 1, wherein the power-generating equipment is a thermoelectric conversion module having a structure in which a plurality of thermoelectric conversion elements are provided in the frame body to extend from one of the pair of transparent substrates toward the other of the pair of transparent substrates.

7. The self-dimming system according to claim 1, wherein the power-generating equipment is a photovoltaic power generation module arranged on the surface of the frame body.

* * * * *